US012176296B2

(12) United States Patent
Koo

(10) Patent No.: US 12,176,296 B2
(45) Date of Patent: Dec. 24, 2024

(54) SEMICONDUCTOR PACKAGE AND ELECTRONIC DEVICE INCLUDING THE SAME

(71) Applicant: SAMSUNG ELECTRONICS CO., LTD., Suwon-si (KR)

(72) Inventor: Jung Eun Koo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/459,698

(22) Filed: Jul. 2, 2019

(65) Prior Publication Data

US 2020/0203311 A1    Jun. 25, 2020

(30) Foreign Application Priority Data

Dec. 21, 2018 (KR) .................. 10-2018-0167169

(51) Int. Cl.
| | | |
|---|---|---|
| H01L 23/544 | (2006.01) | |
| G06F 3/047 | (2006.01) | |
| G06V 40/13 | (2022.01) | |
| H01L 23/00 | (2006.01) | |
| H01L 23/538 | (2006.01) | |
| H01L 25/065 | (2023.01) | |

(52) U.S. Cl.
CPC ............ *H01L 23/544* (2013.01); *G06F 3/047* (2013.01); *G06V 40/13* (2022.01); *H01L 23/5386* (2013.01); *H01L 24/06* (2013.01); *H01L 25/0655* (2013.01); *H01L 2223/54426* (2013.01)

(58) Field of Classification Search
None
See application file for complete search history.

(56) References Cited

U.S. PATENT DOCUMENTS

| | | | | |
|---|---|---|---|---|
| 5,332,922 | A | * | 7/1994 | Oguchi .................. G11C 5/00 |
| | | | | 257/723 |
| 5,838,603 | A | | 11/1998 | Mori et al. |
| 5,959,937 | A | | 9/1999 | Randolph et al. |
| 9,536,863 | B2 | | 1/2017 | Hinck et al. |
| 9,875,387 | B2 | | 1/2018 | Chen |
| 9,882,562 | B1 | * | 1/2018 | Voogel ............... H03K 19/0008 |
| 9,916,055 | B2 | | 3/2018 | Ahn et al. |
| 2003/0174107 | A1 | * | 9/2003 | Watanabe ............ G09G 3/3688 |
| | | | | 345/87 |

(Continued)

FOREIGN PATENT DOCUMENTS

| | | |
|---|---|---|
| CN | 1127428 A | 7/1996 |
| CN | 104142750 A | 11/2014 |

(Continued)

*Primary Examiner* — Benjamin X Casarez
(74) *Attorney, Agent, or Firm* — F. CHAU & ASSOCIATES, LLC

(57) ABSTRACT

A semiconductor package includes a first semiconductor chip and a second semiconductor chip, each including first signal pads, and second signal pads disposed in a region different from that of the first signal pads. The first semiconductor chip and the second semiconductor chip are mounted on a package substrate. The package substrate includes first signal lines connected to the first signal pads and second signal lines connected to the second signal pads. The first signal lines and the second signal lines are disposed in a same layer.

17 Claims, 11 Drawing Sheets

(56) References Cited

U.S. PATENT DOCUMENTS

| | | | |
|---|---|---|---|
| 2005/0162577 A1* | 7/2005 | Yoon | H01L 24/83 257/E21.511 |
| 2006/0113648 A1* | 6/2006 | Chung | H01L 24/06 257/E23.021 |
| 2007/0138654 A1* | 6/2007 | Kim | H01L 23/49838 257/786 |
| 2009/0179835 A1* | 7/2009 | Ito | G09G 3/3688 345/76 |
| 2009/0231324 A1* | 9/2009 | Kotani | G09G 3/3688 345/214 |
| 2009/0273098 A1* | 11/2009 | Bartley | H01L 24/13 257/778 |
| 2010/0134712 A1* | 6/2010 | Tang | G02F 1/13452 349/58 |
| 2010/0155957 A1* | 6/2010 | Han | H01L 24/06 257/773 |
| 2013/0335376 A1* | 12/2013 | Lee | G06F 3/0416 345/174 |
| 2014/0138788 A1 | 5/2014 | Kim et al. | |
| 2014/0210751 A1* | 7/2014 | Okamura | G06F 3/0416 345/173 |
| 2014/0333547 A1* | 11/2014 | Yi | G06F 3/0416 345/173 |
| 2014/0368714 A1 | 12/2014 | Honda et al. | |
| 2014/0374900 A1* | 12/2014 | Kwon | H01L 25/0657 257/737 |
| 2016/0012865 A1* | 1/2016 | Lee | G11C 29/50008 365/51 |
| 2016/0195961 A1* | 7/2016 | Ludden | G06F 3/0412 345/174 |
| 2017/0092622 A1* | 3/2017 | Wu | H01L 24/82 |
| 2017/0287434 A1* | 10/2017 | Uekuri | G09G 5/003 |
| 2018/0033386 A1* | 2/2018 | Enami | G02F 1/13452 |
| 2018/0076235 A1* | 3/2018 | Kim | H01L 24/06 |
| 2020/0019344 A1* | 1/2020 | Lim | G11C 5/063 |

FOREIGN PATENT DOCUMENTS

| | | |
|---|---|---|
| JP | H11150227 | 6/1999 |
| JP | 2005292505 | 10/2005 |
| KR | 10-2013-0127739 | 11/2013 |
| KR | 10-2013-0127740 | 11/2013 |
| KR | 10-2014-0065723 | 5/2014 |
| KR | 10-2017-0096872 | 8/2017 |
| KR | 10-2017-0126330 | 11/2017 |
| KR | 10-2018-0016245 | 2/2018 |

* cited by examiner

SEMICONDUCTOR PACKAGE AND ELECTRONIC DEVICE INCLUDING THE SAME

CROSS-REFERENCE TO RELATED APPLICATION(S)

This application claims benefit of priority to Korean Patent Application No. 10-2018-0167169, filed on Dec. 21, 2018 in the Korean Intellectual Property Office, the disclosure of which is herein incorporated by reference in its entirety.

TECHNICAL FIELD

The present disclosure relates to semiconductors and, more specifically, to a semiconductor package and an electronic device including the same.

DISCUSSION OF THE RELATED ART

A semiconductor package includes a semiconductor chip and a package substrate on which the semiconductor chip is mounted. Various types of electronic devices may make use of packaged semiconductor chips. For example, touch screens, display devices, fingerprint sensors, or the like, may each make use of one or more packaged semiconductor chips. In recent years, as the functions provided by packaged semiconductors have been diversified and a degree of integration of packaged semiconductors has increased, the number of signal lines connected to a single semiconductor package has been increased. Moreover, packaged semiconductors have been developed in which two or more semiconductor chips are mounted on a singly package substrate.

SUMMARY

A semiconductor package includes a first semiconductor chip and a second semiconductor chip, each including first signal pads, and second signal pads disposed in a region different from that of the first signal pads. The first semiconductor chip and the second semiconductor chip are mounted on a package substrate. The package substrate includes first signal lines connected to the first signal pads and second signal lines connected to the second signal pads. The first signal lines and the second signal lines are disposed in a same layer.

A semiconductor package includes a package substrate having a first chip region and a second chip region that is spaced apart from the first chip region. A first semiconductor chip is mounted on the first chip region. A second semiconductor chip is mounted on the second chip region. The second semiconductor chip is substantially identical to the first semiconductor chip but rotated 180 degrees with respect thereto.

An electronic device includes a mainboard including a main processor, a sensor array including a plurality of sensor lines, and a semiconductor package. The semiconductor package includes input/output pads connected to the mainboard, sensor pads connected to the sensor array, a first semiconductor chip mounted on a first mounting region, a second semiconductor chip mounted on a second mounting region, and signal lines electrically connected to the first and second semiconductor chips. The second semiconductor chip is rotated 180 degrees with respect to the first semiconductor chip, and metal lines providing the signal lines are disposed in a single layer.

BRIEF DESCRIPTION OF DRAWINGS

A more complete appreciation of the present disclosure and many of the attendant aspects thereof will be more clearly understood from the following detailed description, taken in conjunction with the accompanying drawings, in which.

DETAILED DESCRIPTION

Figure 1:
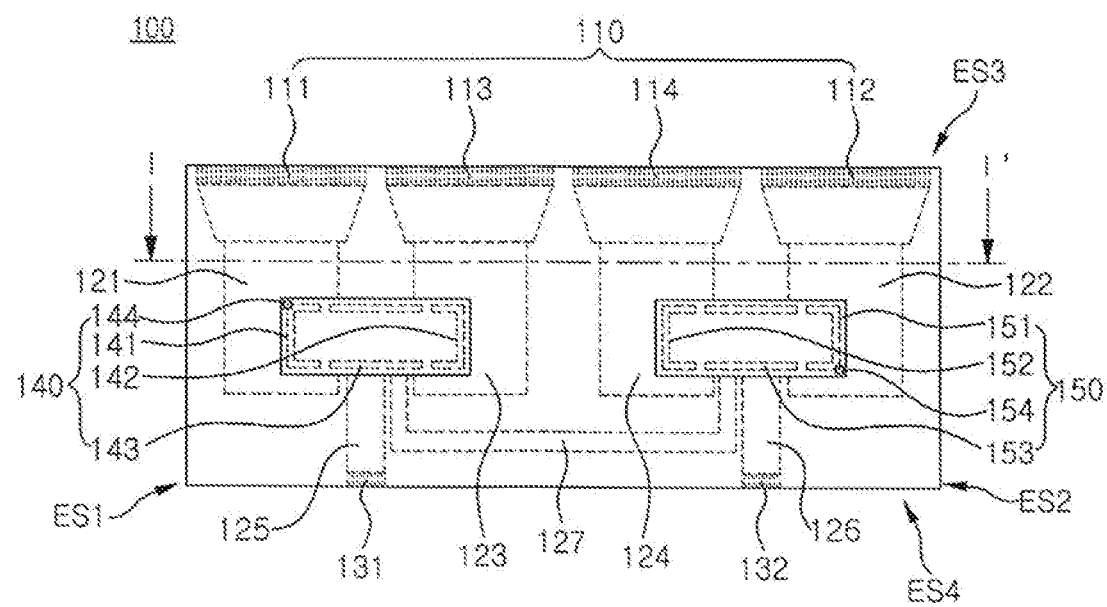
FIG. 1 is a schematic drawing illustrating a semiconductor package according to an exemplary embodiment of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Hereinafter, exemplary embodiments of the present inventive concept will be described in detail with reference to the attached drawings.

Figure 2:
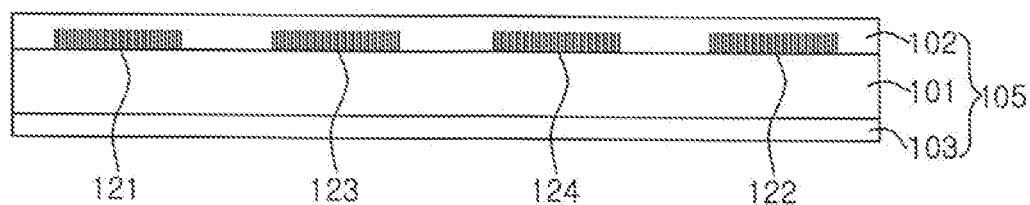
FIG. 2 is a cross-sectional view illustrating a cross-section taken along line I-I' of the semiconductor package illustrated in FIG. 1.

FIG. 1 is a schematic view illustrating a semiconductor package according to an exemplary embodiment of the present disclosure, and FIG. 2 is a cross-sectional view illustrating a cross-section of the semiconductor package taken along line I-I' of FIG. 1.

Referring to FIGS. 1 and 2, a semiconductor package 100, according to an exemplary embodiment of the present disclosure, may include a package substrate 105, and a plurality of semiconductor chips 140 and 150, mounted on the package substrate 105. The package substrate 105 may include a base substrate 101 and protective layers 102 and 103 formed on an upper surface and a lower surface of the base substrate 101, respectively. A plurality of signal lines 121 to 127 are formed on the base substrate 101, and the plurality of signal lines 121 to 127 are connected to at least one of the plurality of semiconductor chips 140 and 150. Referring to FIG. 1, first to fourth side surfaces ES1 to ES4 of the package substrate 105 may be defined in the plane.

For example, a first semiconductor chip 140 and a second semiconductor chip 150 are mounted on the package substrate 105. The first semiconductor chip 140 and the second semiconductor chip 150 may be substantially identical and may have the same structure and the same function. The first semiconductor chip 140 may include a first pad region 141 on which first signal pads are formed and a second pad region 142 on which second signal pads are formed. A third pad region 143 may be formed between the first pad region 141 and the second pad region 142, and third signal pads may be formed on the third pad region 143. The first to third signal pads may be connected to at least a portion of a plurality of signal lines 121 to 127, included in the package substrate 105.

The second semiconductor chip 150 may include a first pad region 151, a second pad region 152, and a third pad region 153, in a manner similar to the first semiconductor chip 140. The first semiconductor chip 140 and the second semiconductor chip 150 may each include reference marks 144 and 154, respectively. Referring to FIG. 1, the second semiconductor chip 150 may be mounted on the package substrate 105 while being rotated 180 degrees with respect to the first semiconductor chip 140. Thus, while being mounted on the package substrate 105, the reference mark 144 of the first semiconductor chip 140 and the reference mark 154 of the second semiconductor chip 150 may be placed in different positions. For example, the reference mark 144 of the first semiconductor chip 140 is shown in an upper-left corner thereof while the reference mark 154 of the second semiconductor chip 150 is shown in a lower-right corner thereof, which is consistent with a 180 degree rotation of one of the chips, which are otherwise identical.

In an exemplary embodiment of the present disclosure, the first signal pads formed on the first pad regions 141 and 151 may be provided as signal pads for inputting and outputting a first signal, and the second signal pads formed on the second pad regions 142 and 152 may be provided as signal pads for inputting and outputting a second signal. The first signal and the second signal may be different signals. For example, when the semiconductor package 100 is connected to a sensor array of a touch screen, a fingerprint sensor, or the like, the first signal may be a driving signal input to the sensor array, and the second signal may be a sensing signal output by the sensor array. In an exemplary embodiment of the present disclosure, when the semiconductor package 100 is connected to a display panel, the first signal may be a gate signal input to a gate line of the display panel, and the second signal may be a source signal input to a source line of the display panel.

The sensor array, such as the touch screen or the fingerprint sensor, and the display panel may communicate with the semiconductor package 100 through the plurality of pads 110 (including pads 111 to 114) disposed along to the third side surface ES3 of the semiconductor package 100. The plurality of pads (including pads 111 to 114) may be connected to the first to fourth signal lines 121 to 124.

Referring to FIG. 1, the first signal pads of the first pad regions 141 and 151 are connected to the first signal lines 121 and 122, and the second signal pads of the second pad regions 142 and 152 may be connected to the second signal lines 123 and 124. The first semiconductor chip 140 and the second semiconductor chip 150 are mounted on the package substrate 105 while being rotated 180 degrees with respect to one another. In this regard, the second pad regions 142 and 152 of the first semiconductor chip 140 and the second semiconductor chip 150 may be disposed between the first pad region 141 of the first semiconductor chip 140 and the first pad region 151 of the second semiconductor chip 150. For example, the first pad region 141 of the first semiconductor chip 140 may be disposed closer to the first side surface ES1 of the package substrate 105 than the second pad region 142. In a similar manner, the first pad region 151 of the second semiconductor chip 150 may be disposed closer to the second side surface ES2 of the package substrate 105, than the second pad region 152.

In an exemplary embodiment of the present disclosure, as illustrated in FIG. 2, the first signal lines 121 and 122 and the second signal lines 123 and 124 are all disposed at the same layer on the package substrate 105. The first signal lines 121 and 122 and the second signal lines 123 and 124 are all disposed in a single layer in the package substrate 105. In this regard, a process for connecting the first signal lines 121 and 122 to the first signal pads, and connecting the second signal lines 123 and 124 to the second signal pads may be simplified. Moreover, a process for forming a via for connecting the first signal lines 121 and 122 the second signal lines 123 and 124, formed in a plurality of layers, to the first signal pads and the second signal pads, may be omitted. Thus, a manufacturing process may be simplified and manufacturing costs may be reduced, while a thickness of the semiconductor package 100 may be reduced to provide a higher a degree of integration.

A portion of the third signal pads, formed in the third pad regions 143 and 153, may be connected to the input/output pads 131 and 132 to provide for communications of the first semiconductor chip 140 and the second semiconductor chip 150 with other semiconductor chips outside the semiconductor package 100 through input and output lines 125 and 126. Moreover, a portion of the third signal pads may be provided as a chip communication pad connected to a chip communication 127 for transmitting and receiving data between the first semiconductor chip 140 and the second semiconductor chip. In an exemplary embodiment of the present disclosure, the first semiconductor chip 140 and the second semiconductor chip 150 may be operated in a master-slave manner through a chip communication line 127.

In the first semiconductor chip 140, the third signal pads may be duplicately disposed in edges opposing each other. The third pad regions 143, adjacent to each of edges opposing each other, may be defined between the first pad region 141 and the second pad region 142. In the third pad regions 143, the third signal pads, opposing each other, may be a pad inputting and outputting the same signal. As the third signal pads, opposing each other, input and output the same signal, the first semiconductor chip 140 and the second semiconductor chip 150, mounted on the package substrate 105 while being rotated 180 degree, may simultaneously transmit and receive a signal with other external semiconductor chips through the input/output pads 131 and 132. The first semiconductor chip 140 and the second semiconductor chip 150, having the same structure and the same function, may implement the semiconductor package 100 having a plurality of semiconductor chips 140 and 150, thereby increasing efficiency of a manufacturing process and reducing manufacturing costs.

Figure 3:
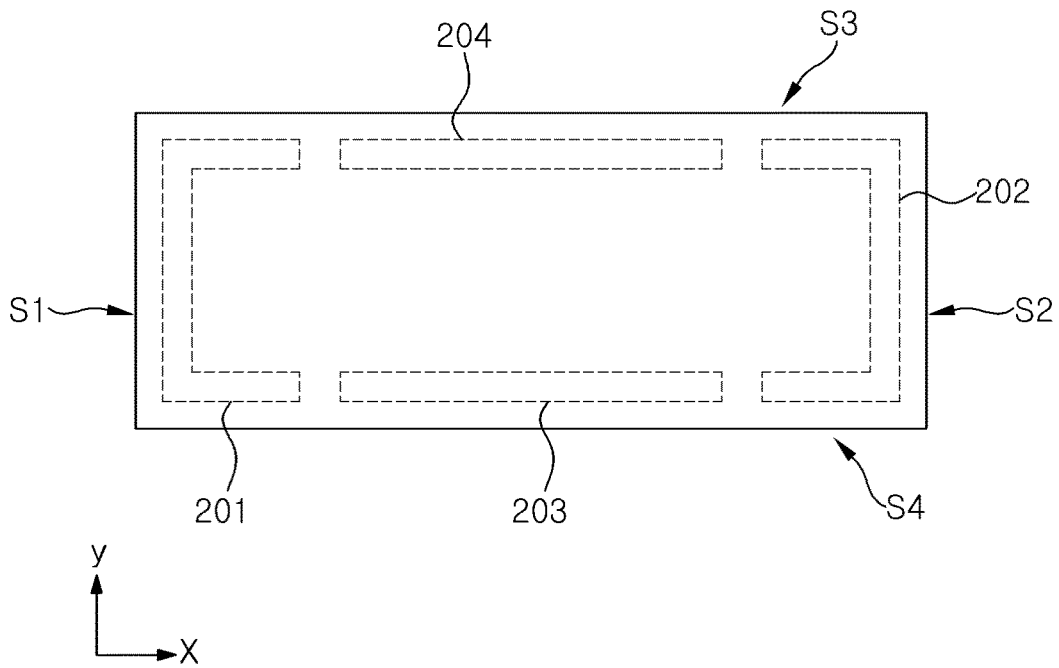
FIGS. 3 and 4 are drawings illustrating a semiconductor chip included in a semiconductor package according to an exemplary embodiment of the present disclosure.
Figure 4:
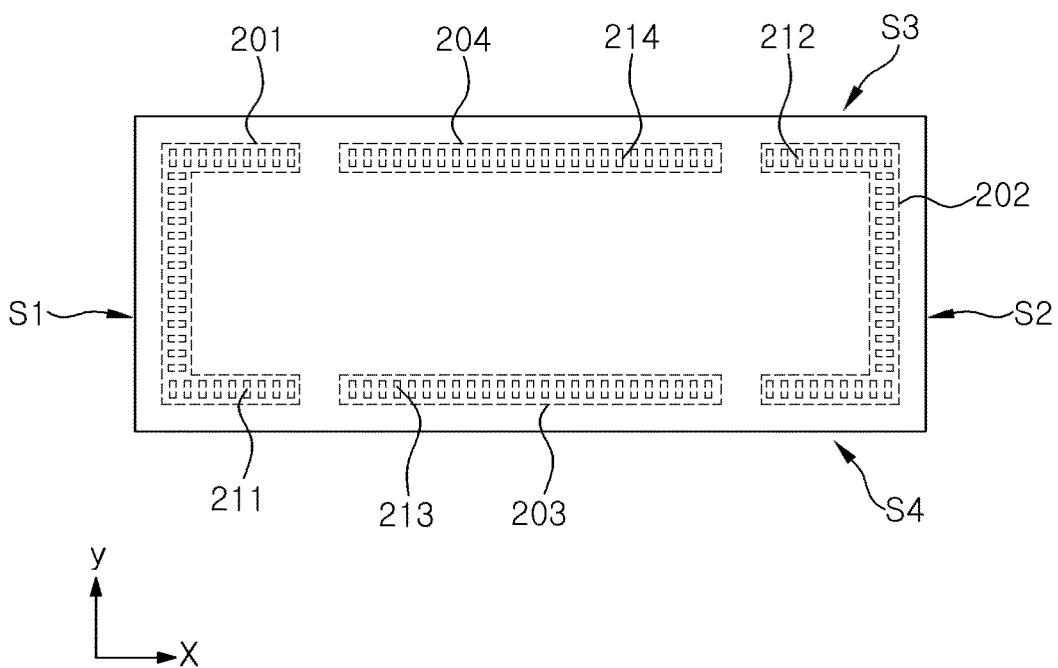

FIGS. 3 and 4 are drawings illustrating a semiconductor chip included in a semiconductor package according to an exemplary embodiment of the present disclosure.

Referring to FIGS. 3 and 4, a semiconductor chip 200, according to an exemplary embodiment of the present disclosure, may include first to fourth side surfaces S1 to S4, and a plurality of pad regions 201 to 204, adjacent to at least one of the first to fourth side surfaces S1 to S4.

First signal pads 211 may be disposed in a first pad region 201, and second signal pads 212 may be disposed in a second pad region 202. Third signal pads 213 and fourth signal pads 214 may be disposed in a third pad region 203 and a fourth pad region 204, respectively. The third pad region 203 and the fourth pad region 204 may be disposed adjacent to each other in the third side surface S3 and the fourth side surface S4, opposing each other. Each of the third signal pads 213 and the fourth signal pads 214, opposing each other, may provide the same function. The third signal pads 213 and the fourth signal pads 214 may each have a dual structure.

A size of each of the plurality of pad regions 201 to 204 may be determined according to the number of the first to fourth signal pads 211 to 214. For example, according to the number of the first signal pads 211, the first pad region 201 may be adjacent to at least one among the first side surface S1, the third side surface S3, and the fourth side surface S4. If the number of the first signal pads 211 is small, the first pad region 201 may be disposed only along to the first side surface S1, or may be adjacent to at least one between the third side surface S3 and the mall side surface S4. The second pad region 202 may be defined as a structure symmetrical with respect to the first pad region 201. For example, there may be mirror image symmetry among the pad regions 201 to 204 along an x-axis centerline and a y-axis centerline thereof.

In an exemplary embodiment of the present disclosure, the first signal pads 211 transmit and receive a first signal, and the second signal pads 212 transmit and receive a second signal. The first signal and the second signal may be different signals. For example, when the semiconductor chip 200 includes a driving circuit for driving a touch screen or a fingerprint sensor, the first signal is a driving signal input to first lines of a sensor array, and the second signal may be a sensing signal output to second lines, intersecting the first lines. For example, the first signal may be a signal input to gate lines of a display panel, and the second signal may be a signal input to source lines of the display panel.

In an exemplary embodiment of the present disclosure, the third signal pads 213 and the fourth signal pads 214, disposed in the same position in a first direction (an X-axis direction), may provide the same function. The third signal pads 213 may provide pads necessary for the semiconductor chip 200 to communicate with other semiconductor chips. Other semiconductor chips, communicating with the semiconductor chip 200 through the third signal pads 213, may be a chip included in a semiconductor package that may be the same as the semiconductor chip 200, or included in a semiconductor package different from the semiconductor chip 200.

Figure 5:
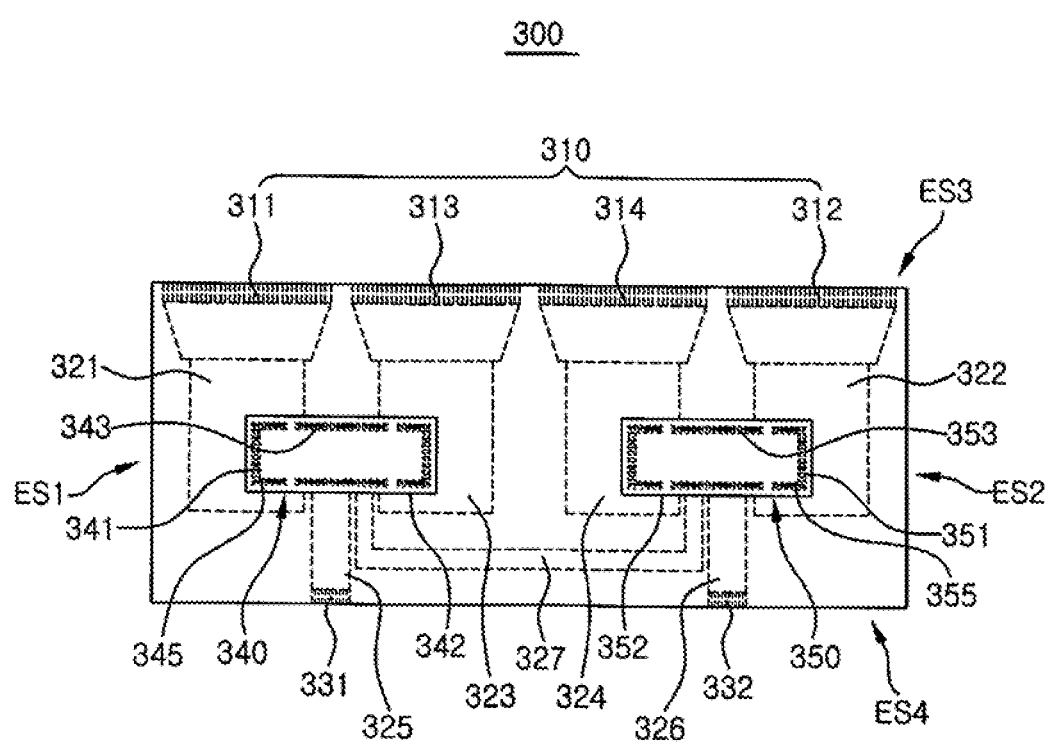
FIG. 5 is a drawing illustrating a package substrate included in a semiconductor package according to an exemplary embodiment of the present disclosure.

FIG. 5 is a drawing illustrating a package substrate included in a semiconductor package according to an exemplary embodiment of the present disclosure.

Referring to FIG. 5, a package substrate 300, according to an exemplary embodiment of the present disclosure, may include a plurality of pads 310, including pads 311 to 314, input/output pads 331 and 332, a plurality of mounting regions 340 and 350, and a plurality of signal lines 321 to 327. In each of the plurality of mounting regions 340 and 350, a semiconductor chip may be mounted. Thus, a plurality of semiconductor chips may be mounted on the package substrate 300 according to an exemplary embodiment of the present disclosure illustrated in FIG. 5.

A plurality of chip pads 345 are formed on the first mounting region 340, and the plurality of chip pads 345 may be connected to signal pads of the semiconductor chip mounted on the first mounting region 340. The plurality of chip pads 345 may include first chip pads disposed in the first region 341, second chip pads disposed in the second region 342, and third chip pads disposed in the third region 343. The third region 343 may include a pair of regions opposing each other between the first region 341 and the second region 342. The number of third chip pads, included in each of a pair of third region 343, may be the same.

The second mounting region 350 may be defined as having a structure similar to that of the first mounting region 340. The second mounting region 350 may include first to third regions 351 to 353, in which a plurality of chip pads are disposed. For example, the second mounting region 350 may have a form in which the first mounting region 340 is rotated 180 degrees with respect to the first mounting region 340. Thus, the second chip pads of the second mounting region 350 may be disposed adjacent to the second chip pads of the first mounting region 340, Moreover, the second chip pads, of the first mounting region and the second mounting region, may be disposed between first chip pads of the first mounting region and second chip pads of the second mounting region.

The first chip pads, of the first mounting region 340 and the second mounting region 350, are connected to the first signal lines 311 and 312, and the second chip pads may be connected to the second signal lines 313 and 314. As the second chip pads are disposed between the first chip pads, as illustrated in FIG. 5, the second signal lines 313 and 314 may be disposed between the first signal lines 311 and 312. Thus, the plurality of signal lines 311 to 314 might not intersect each other, and the plurality of signal lines 311 to 314 are formed in a single layer to reduce process costs and reduce a thickness of the package substrate 300.

The third chip pads may be connected to the signal line 327 for communications between the semiconductor chips, mounted on each of the first mounting region 340 and the second mounting region 350, or may be connected to the signal lines 325 and 326, connected to the input/output pads 331 and 332. For example, the third chip pads, formed on an upper portion of each of the first mounting region 340 and the second mounting region 350, might not be connected to separate signal lines. Alternatively, the third chip pads might not be formed on an upper portion of each of the first mounting region 340 and the second mounting region 350.

Figure 6:
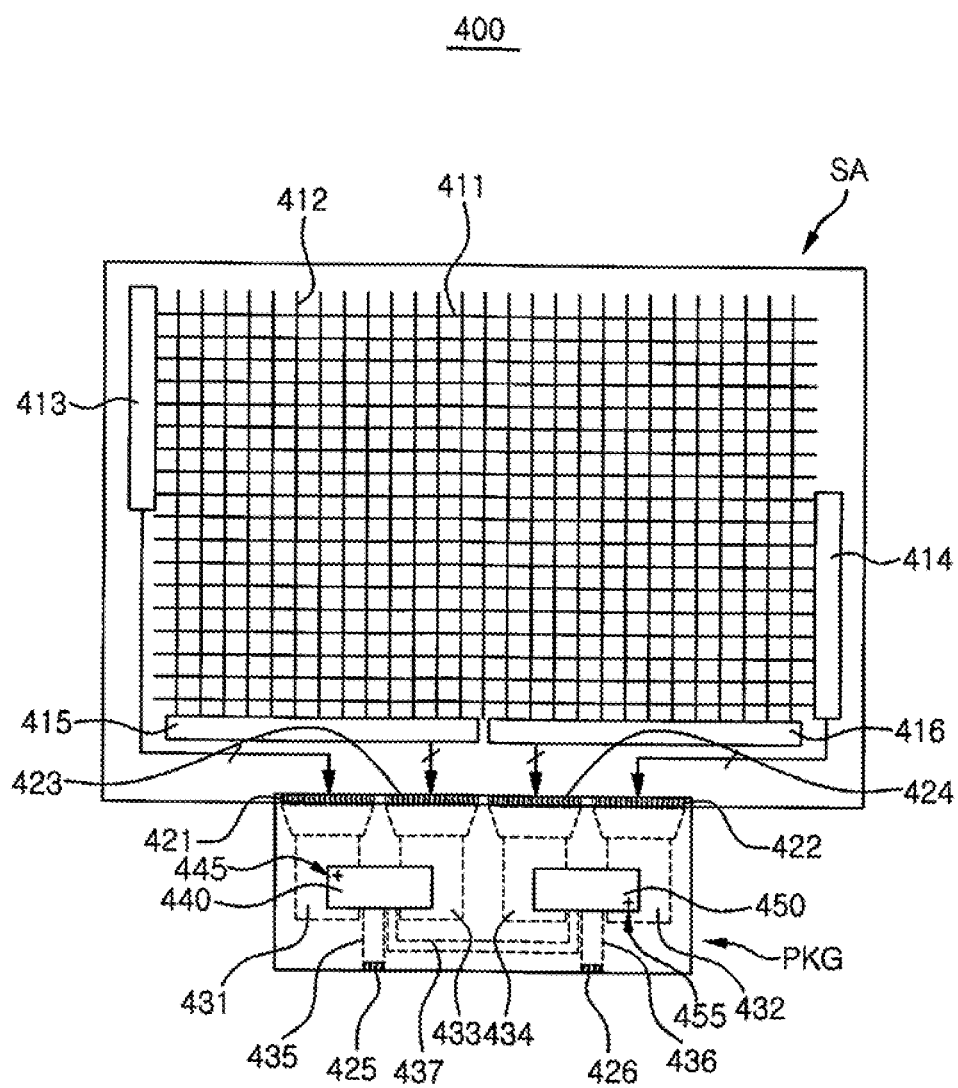
FIGS. 6 to 8 are schematic drawings illustrating a semiconductor package according to an exemplary embodiment of the present disclosure.
Figure 7:
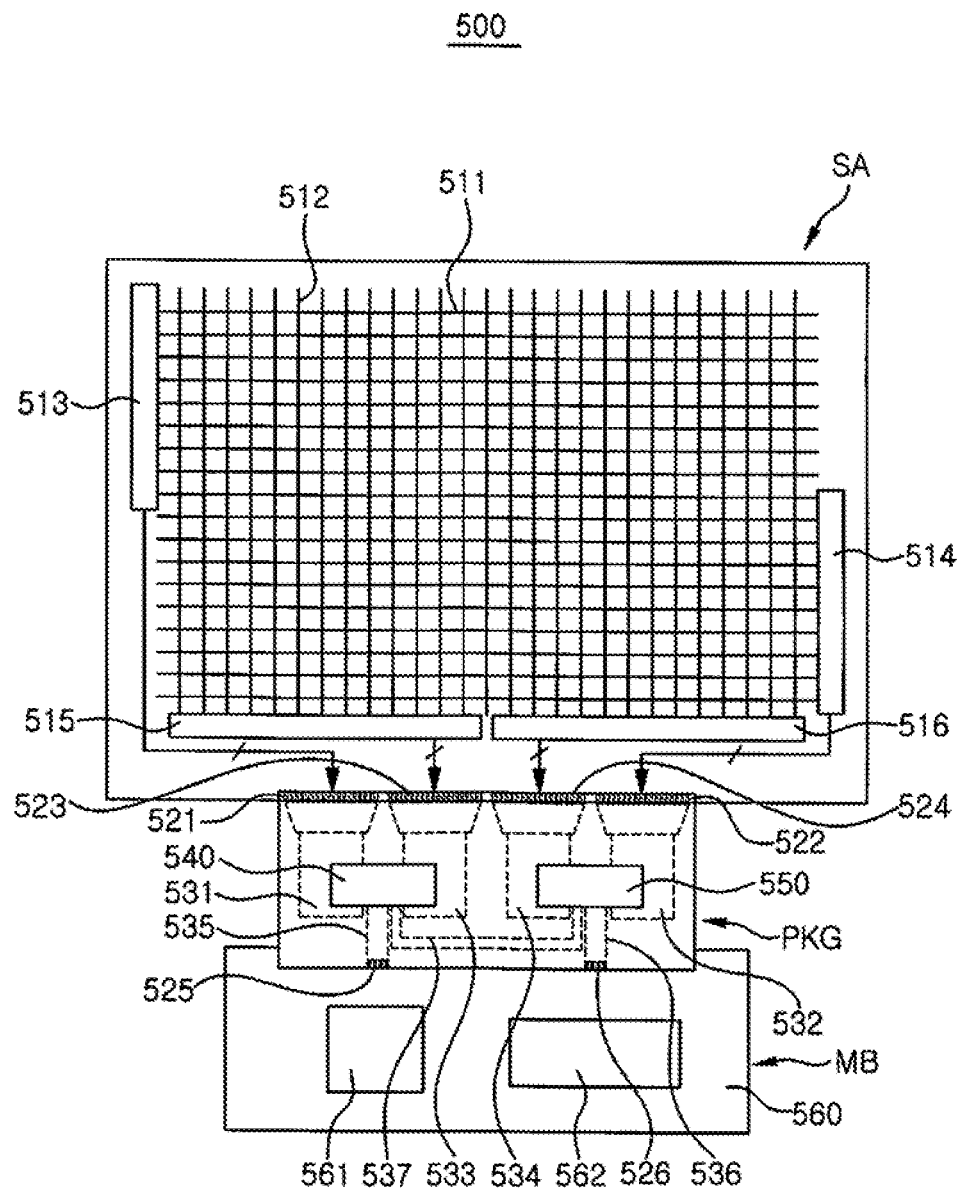

FIGS. 6 and 7 are schematic drawings illustrating an electronic device including a semiconductor package according to an exemplary embodiment of the present disclosure.

First, referring to FIG. 6, a semiconductor package PKG, according to an exemplary embodiment of the present disclosure, is combined with a sensor array SA to form an electronic device 400. The sensor array SA may include a plurality of sensor lines 411 and 412, for providing a touch screen or a fingerprint sensor. The sensor lines 411 and 412 may be connected to the semiconductor chips 440 and 450 through a plurality of sensor pads 421 to 424, formed in the semiconductor package PKG. The sensor array SA may further include a plurality of connection pads 413 to 416 for connecting the sensor lines 411 and 412 to the sensor pads 421 to 424.

The semiconductor package PKG, according to an exemplary embodiment of the present disclosure, may be connected to the sensor array SA having a large number of sensor lines 411 and 412. As the number of sensor lines 411 and 412 is increased, it may be difficult for a single semiconductor chip to drive the sensor array SA or process a signal obtained from the sensor array SA. Thus, to drive a single sensor array SA or obtain sensing signals, a portion of the sensor lines 411 and 412 may be connected to the first semiconductor chip 440, and a remaining portion of the sensor lines 411 and 412 may be connected to the second semiconductor chip 450.

To increase process yield and lower manufacturing costs, the first semiconductor chip 440 and the second semiconductor chip 450 may be substantially identical and may have the same structure. When the first semiconductor chip 440 and the second semiconductor chip 450 are identical, sensor pads, connected to the first sensor lines 411, and sensor pads, connected to the second sensor lines 412, may be formed together in the same region of the first semiconductor chip 440 and the second semiconductor chip 450. In this case, to connect the first semiconductor chip 440 and the second semiconductor chip 450 to the sensor lines 411 and 412, the plurality of signal lines 431 to 437 may be formed in the semiconductor package PKG and dispersed in a plurality of layers, thereby resulting in increased manufacturing costs.

In an exemplary embodiment of the present disclosure, the first semiconductor chip 440 and the second semiconductor chip 450, which may be identical chips, may be mounted on the semiconductor package PKG while being rotated 180 degrees with respect to each other. Referring to FIG. 6, reference marks 445 and 455 may be located at different positions in each of the first and second semiconductor chips 440 and 450, respectively. Thus, in the semiconductor package PKG, the plurality of signal lines 431 to 437 are formed in a single layer, thereby reducing manufacturing costs.

In an exemplary embodiment of the present disclosure illustrated in FIG. 6, the first semiconductor chip 440 may be connected to a portion of the first signal lines 411, and a portion of the second signal lines 412. In a similar manner, the second semiconductor chip 450 may be connected to a remaining portion of the first signal lines 411, and a remaining portion of the second signal lines 412. For example, while the first signal lines 411 connected to the first semiconductor chip 440 are driven, to obtain a signal corresponding to touch input or fingerprint input from the second signal lines 412 connected to the second semiconductor chip 450, the first semiconductor chip 440 and the second semiconductor chip 450 may be operated in synchronization. The first semiconductor chip 440 and the second semiconductor chip 450 may exchange data necessary for synchronization through a chip communication line 437. Moreover, the first semiconductor chip 440 and the second semiconductor chip 450 may be connected to other external semiconductor packages through the input/output pads 425 and 426.

Next, referring to FIG. 7, an electronic device 500 may further include a mainboard MB, in addition to the sensor array SA and the semiconductor package PKG. The mainboard MB may include a mainboard substrate 560 and a plurality of semiconductor chips 561 and 562 mounted thereabove. The plurality of semiconductor chips 561 and 562, included in the mainboard MB, may include a main processor 561 and a main memory 562. The number and types of the plurality of semiconductor chips 561 and 562 included in the mainboard MB may be changed variously, according to exemplary embodiments of the present disclosure. For example, when the electronic device 500 has a configuration of a smartphone, the main processor 561 may be an application processor, and the main memory 562 may be implemented as a dynamic random access memory (DRAM), or a NAND flash memory.

The main processor 561 and/or the main memory 562 may generate a control command, the data, or the like, and then transmit the control command, data, or the like, to the first and second semiconductor chips 540 and 550 of the semiconductor package PKG through the input/output pads 525 and 526. The first and second semiconductor chips 540 and 550 may control the sensor array SA using the control command, the data, and the like, received from the mainboard MB. The first and second semiconductor chips 540 and 550 may control the first sensor lines 511 and the second sensor lines 512 through the sensor pads 521 to 524, thereby obtaining data corresponding to touch input, fingerprint input, or the like.

In an exemplary embodiment of the present disclosure illustrated in FIG. 7, the first semiconductor chip 540 and the second semiconductor chip 550 may be mounted on the package substrate while being rotated 180 degrees with respect to each other. Thus, the signal lines 531-537, connected to the first and second sensor lines 511 and 512, may be formed in a single layer, thereby reducing costs and the time, required for manufacturing the semiconductor package PKG. It is noted that elements 513 to 516 are connection pads and elements 531 to 537 are signal lines.

Figure 8:
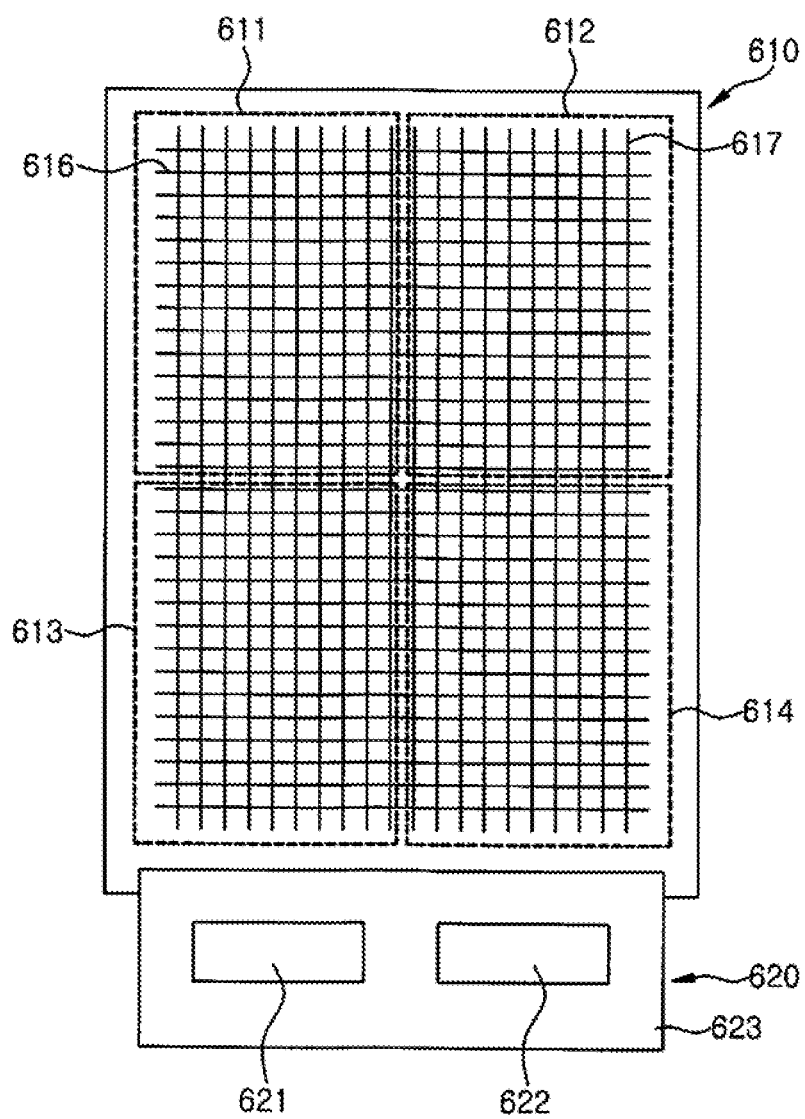
Figure 9:
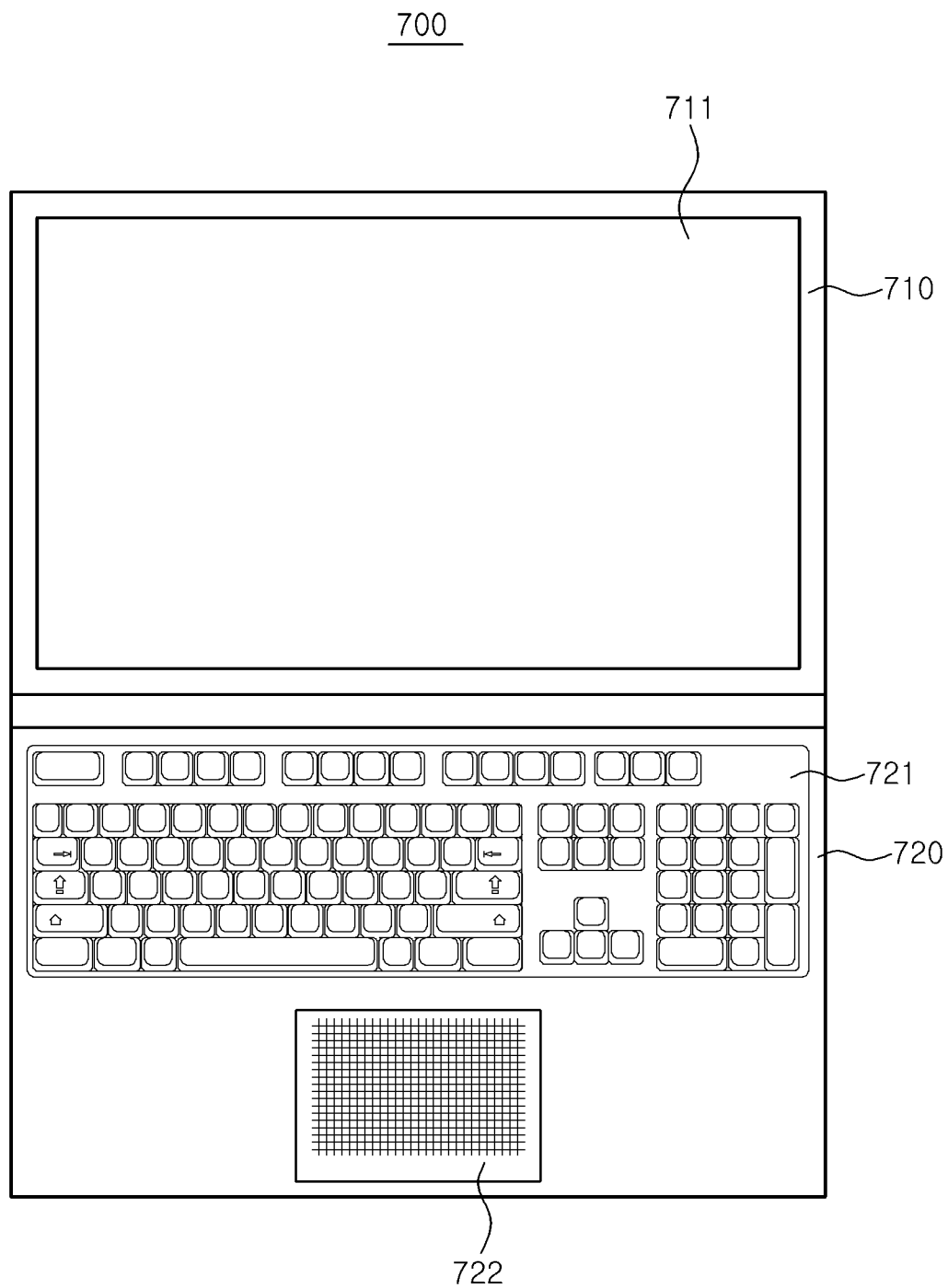
FIGS. 9 to 10 are drawings illustrating an electronic device including a semiconductor package according to an exemplary embodiment of the present disclosure.
Figure 10:
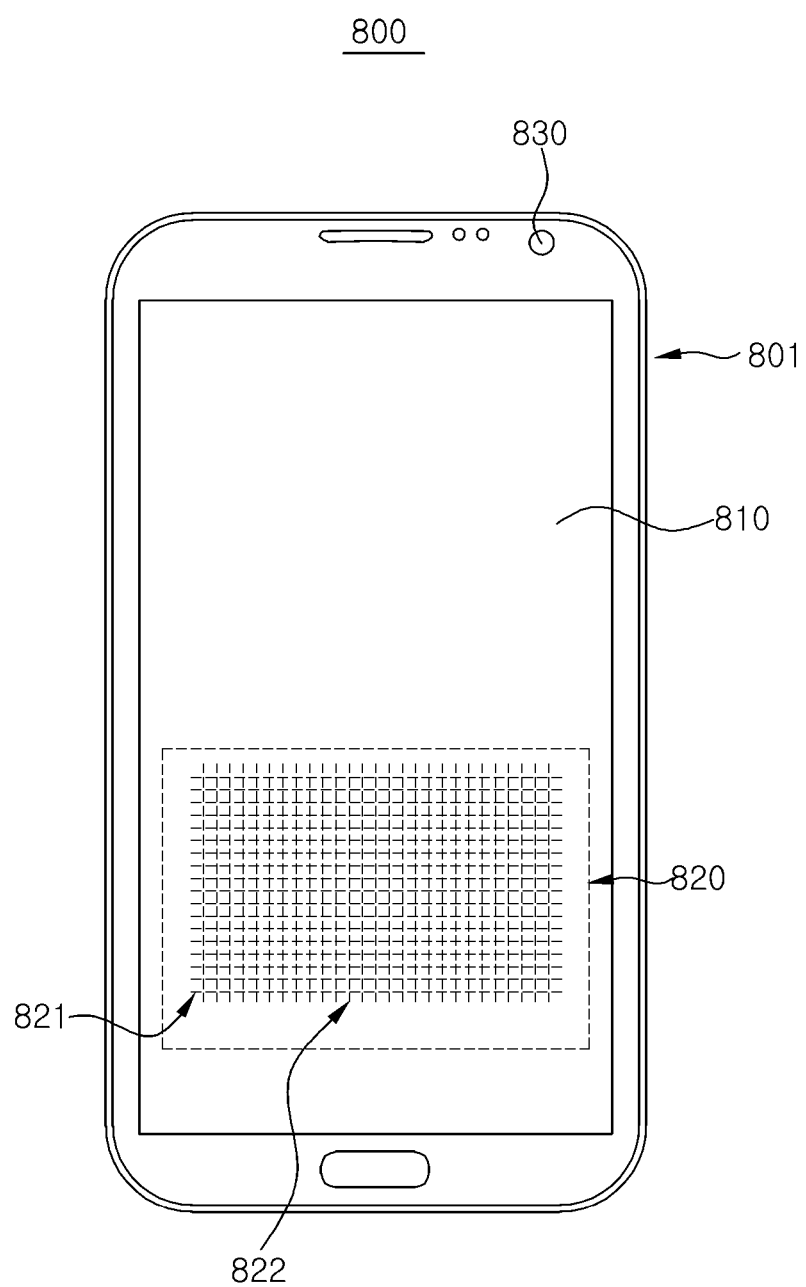

FIGS. 8 to 10 are drawings illustrating an electronic device including a semiconductor package according to an exemplary embodiment of the present disclosure.

FIG. 8 is a drawing illustrating a touch screen device to which a semiconductor package according to an exemplary embodiment of the present disclosure is applied. Referring to FIG. 8, a touch screen device 600 may include a sensor array 610 having first sensor lines 616 and second sensor lines 617, and a semiconductor package 620 connected to the sensor array 610. The semiconductor package 620 may include a first semiconductor chip 621, a second semiconductor chip 622, and a package substrate 623, on which the first semiconductor chip 621 and the second semiconductor chip 622 are mounted.

In an exemplary embodiment of the present disclosure, the sensor array 610 may be divided into first to fourth regions 611 to 614. For example, the first sensor lines 616, included in the first region 611 and the second region 612, may be connected to the first semiconductor chip 621, and the first sensor lines 616, included in the third region 613 and the fourth region 614, may be connected to the second semiconductor chip 622. Moreover, the second sensor lines 617, included in the first region 611 and the third region 613, may be connected to the first semiconductor chip 621, and the second sensor lines 617, included in the second region 612 and the fourth region 614, may be connected to the second semiconductor chip 622.

The first semiconductor chip 621 and the second semiconductor chip 622 may be connected to the first sensor lines 616 and the second sensor lines 617 through signal lines formed in the package substrate 623. Each of the first semiconductor chip 621 and the second semiconductor chip 622 may be connected to signal lines of the package substrate 623 through signal pads formed on, the left and right sides thereof. In an exemplary embodiment of the present disclosure, the first semiconductor chip 621 and the second semiconductor chip 622 may be chips having a substantially identical structure, and the first semiconductor chip 621 and the second semiconductor chip 622 may be mounted on the package substrate 623 while being rotated 180 degrees with respect to each other. Thus, signal lines connecting the first and second sensor lines 616 and 617 to the first and second semiconductor chips 621 and 622 may be formed in a single layer in the package substrate 623.

FIGS. 9 and 10 are drawings illustrating a fingerprint sensing device to which a semiconductor package, according to an exemplary embodiment of the present disclosure, is applied. First, referring to FIG. 9, a fingerprint sensing device according to an exemplary embodiment of the present disclosure may be adapted in a device having a touch pad 722 as an input device, such as a laptop computer 700.

In an exemplary embodiment of the present disclosure illustrated in FIG. 9, a laptop computer 700 may include a first housing 710 and a second housing 720, and the first housing 710 may be provided with a display 711. Moreover, the second housing 720 is provided with an input device such as a keyboard 721 and the touch pad 722.

A fingerprint sensing device may be adapted to determine whether a user of the laptop, computer 700 is a legitimate user (e.g. to authenticate the user), and to this end, the touch pad 722 may provide a function of a fingerprint sensing device, without the need for a separate fingerprint sensing device. In this case, for the convenience of the user, an entire area of the touch pad 722 may provide a function of the fingerprint sensing device.

In order to provide a fingerprint sensing function in an entire area of the touch pad 722, as illustrated in FIG. 9, sensor lines may be disposed compactly enough to sense distinguishing characteristics of a fingerprint in the entirety of the touch pad 722. Thus, the number of sensor lines of the touch pad 722 may be increased accordingly. Moreover, when the number of sensor lines is too high to be covered by a single semiconductor chip, sensor lines may be controlled using two or more semiconductor chips.

In an exemplary embodiment of the present disclosure, multiple semiconductor chips having the same structure may be mounted on a semiconductor package connected to a sensor array of the touch pad 722 having sensor lines formed therein. For example, the semiconductor chips may be mounted while being rotated 180 degrees with respect to each other. Thus, signal lines connecting semiconductor chips to sensor lines are disposed in a single layer in a semiconductor package, so a metal line layer providing signal lines is provided to one, thereby reducing costs and the time of a manufacturing process.

Next, referring to FIG. 10, a fingerprint sensing device according to an exemplary embodiment of the present disclosure may be provided integrally with a touch screen in an electronic device in which a touch screen is provided as an input device such as a smartphone or a tablet computer. In an exemplary embodiment of the present disclosure illustrated in FIG. 10, a smartphone 800 may include a housing 801, a touch screen 810 provided in the housing 801 to sense touch input of a user, a fingerprint sensor 820 provided in at least a region of the touch screen 810, and a camera portion 830.

The fingerprint sensor 820 may be provided integrally with the touch screen 810 depending on need, such as design or user convenience. For example, the finger print sensor 820 may be a large section of the touch screen 810. This may significantly increase the number of sensor lines 821 and 822 included in the fingerprint sensor 820, and as a result, the sensor lines 821 and 822 might not be driven using a single semiconductor chip.

In an exemplary embodiment of the present disclosure, the fingerprint sensor 820 may be operated using a semiconductor package in which a plurality of semiconductor chips are mounted on a single package substrate. The semiconductor chips, included in the semiconductor package, may be substantially identical and may have the same structure. In order to form the signal lines, connecting the semiconductor chips to the sensor lines 821 and 822, in a single layer in a package substrate, the semiconductor chips may be mounted on a package substrate while being rotated 180 degrees with respect to one another.

Figure 11:
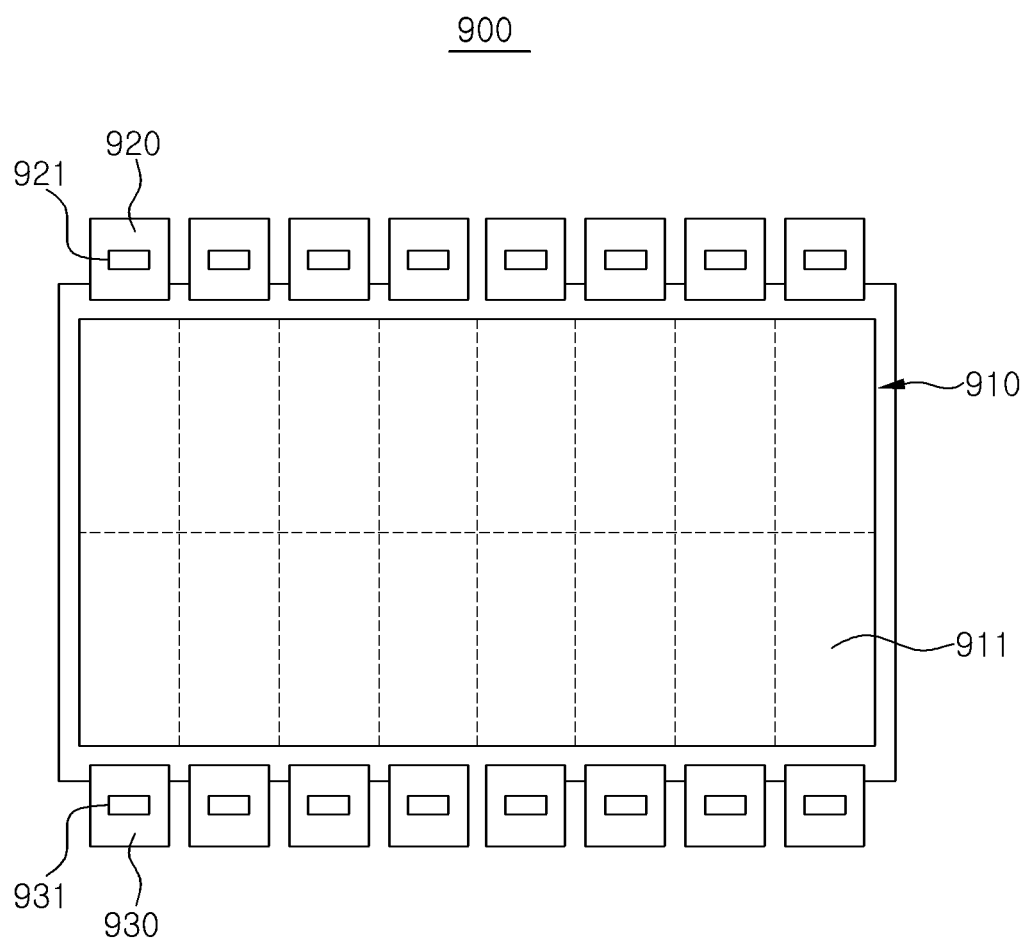
FIGS. 11 and 12 are drawings illustrating a display device including a semiconductor package according to an exemplary embodiment of the present disclosure.
Figure 12:
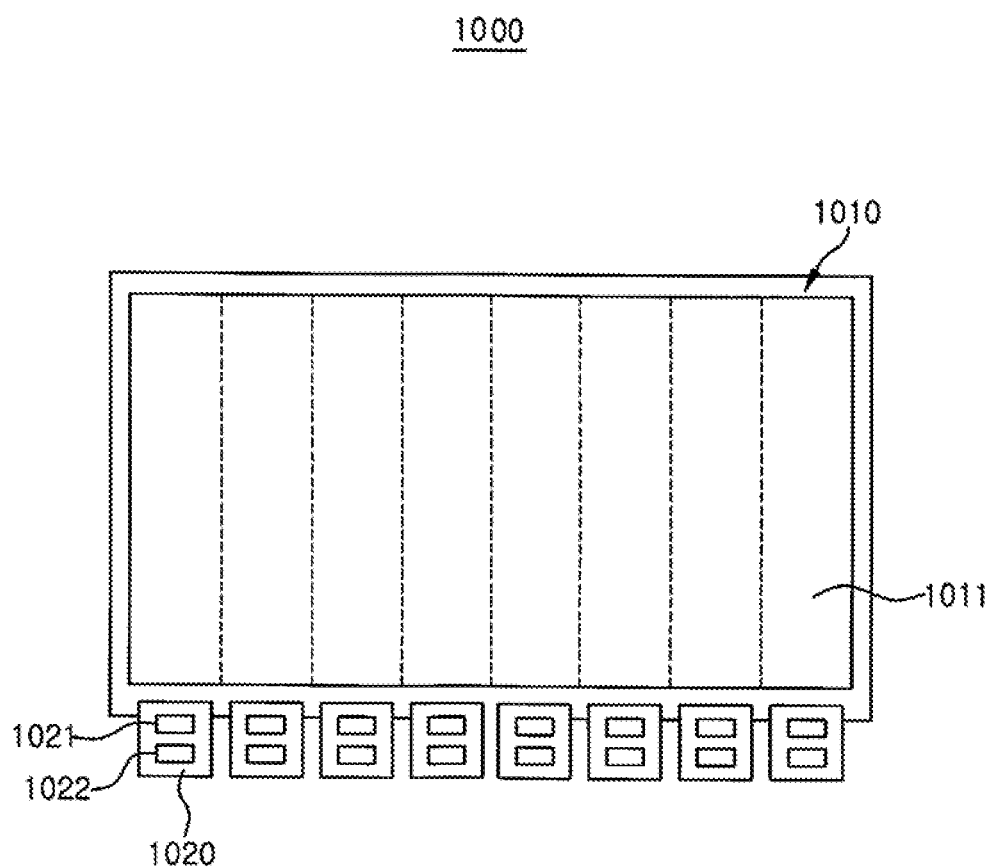

FIGS. 11 and 12 are drawings illustrating a display device including a semiconductor package according to an exemplary embodiment of the present disclosure.

FIG. 11 illustrates a comparative example illustrating a display device according to an exemplary embodiment of the present disclosure. Referring to the comparative example of FIG. 11, a display device 900 may include a display panel 910 and semiconductor packages 920 and 930. The display panel 910 is divided into a plurality of regions 911, and each of the plurality of regions 911 may be driven by semiconductor packages 920 and 930 adjacent thereto.

The semiconductor packages 920 and 930 may include semiconductor chips 921 and 931 having a display driver circuit. Each of the semiconductor packages 920 and 930 may include one of the semiconductor chips 921 and 931. As a size and resolution of the display panel 910 are increased, the number of pixels included in each of the plurality of regions 911 may be increased. Thus, a plurality of regions 911 may be defined in a manner in which the display panel 910 is divided in horizontal and vertical directions, and each of the plurality of regions 911 may be driven by the semiconductor chips 921 and 931 adjacent thereto. Thus, a bezel size of the display device 900 may be increased by the presence of the semiconductor packages 920 and 930.

FIG. 12 is a drawing illustrating a display device 1000 according to an exemplary embodiment of the present disclosure. Referring to FIG. 12, a display device 1000 may include a display panel 1010 and semiconductor packages 1020. The display panel 1010 is divided into a plurality of regions 1011, and each of the plurality of regions 1011 may be driven by semiconductor chips 1021 and 1022 included in semiconductor packages 1020 adjacent and connected thereto in a vertical direction.

For example, in an exemplary embodiment of the present disclosure illustrated in FIG. 12, each of the plurality of regions 1011 may be operated by the semiconductor chips 1021 and 1022, included in each of the semiconductor packages 1020. Thus, the semiconductor packages 1020 may only be connected to an upper portion or a lower portion of the display panel 1010, and a bezel size of the display device 1000 may be reduced.

A configuration of the semiconductor packages 1020 may be similar to what is described above. For example, the semiconductor chips 1021 and 1022 may be substantially identical and may have the same structure, and may be mounted on each of the semiconductor packages 1020 while being rotated 180 degrees with respect to each other. Thus, a plurality of signal lines connected to the semiconductor chips 1021 and 1022 may be disposed in a single layer.

Figure 13:
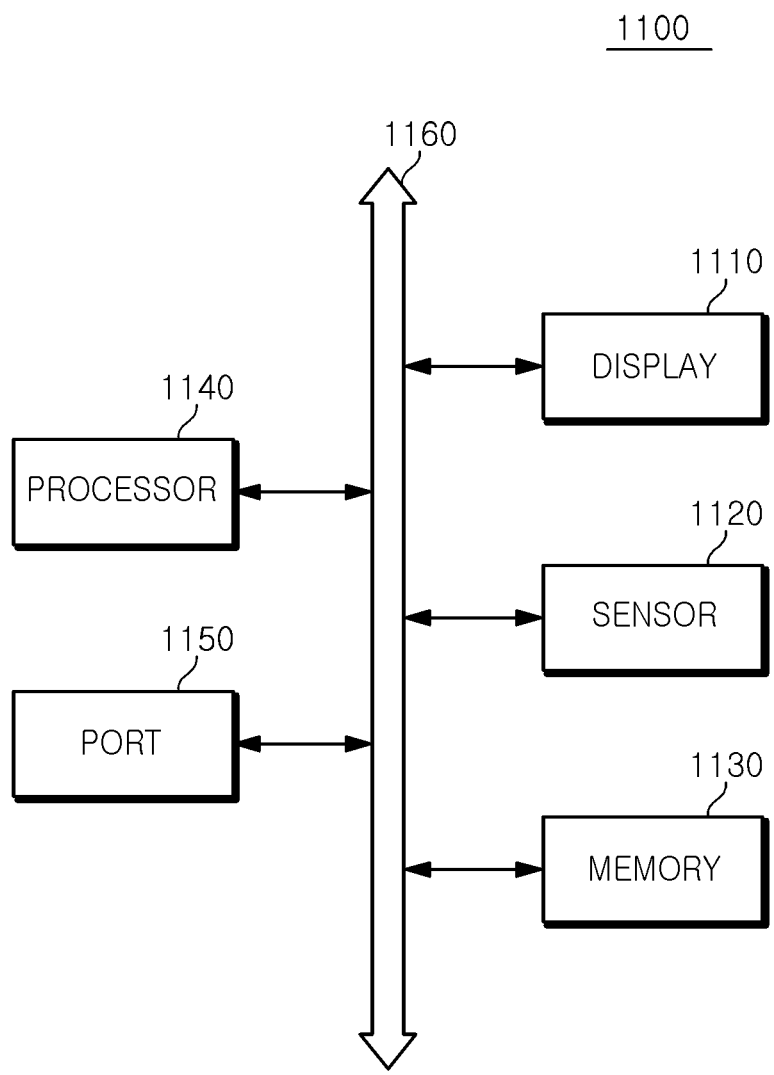
FIG. 13 is a block diagram illustrating an electronic device including a semiconductor package according to an exemplary embodiment of the present disclosure.

FIG. 13 is a schematic block diagram illustrating an electronic device including a semiconductor package according to an exemplary embodiment of the present disclosure.

A computer device 1100, according to an exemplary embodiment of the present disclosure illustrated in FIG. 13, may include a display 1110, a sensor 1120, a memory 1130, a processor 1140, a port 1150, and the like. The computer device 1100 may further include a wire/wireless communications device, a power supply, and the like. Among components illustrated in FIG. 13, the port 1150 may be provided for the computer device 1100 to communicate with a video card, a sound card, a memory card, a universal serial bus (USB) device, and the like. The computer device 1100 may be a concept including a smartphone, tablet PC, a smart wearable device, and the like, as well as a desktop computer and a laptop computer according to the related art.

The processor 1140 may perform a certain operation, a command, a task, and the like. The processor 1140 may be a central processing unit (CPU) or a microprocessor unit (MCU), and may communicate with the display 1110, the sensor 1120, the memory device 1130, and other devices connected to the port 1150 through a bus 1160.

The memory 1130 may be a storage medium storing data for an operation of the computer device 1100, or multimedia data. The memory 1130 may include a volatile memory such as a random access memory (RAM) or a non-volatile memory such as a flash memory. In addition, the memory 1130 may include at least one of a solid state drive (SSD), a hard disk drive (HDD), and an optical disk drive (ODD), as a storage device. The sensor 1110 may include various sensor devices such as a touch screen, a fingerprint sensor, and the like.

The semiconductor package according to an exemplary embodiment of the present disclosure may be applied to various components such as the display 1110, the sensor 1120, the memory 1130, and the like. In detail, the semiconductor package according to an exemplary embodiment of the present disclosure is applied to a component having a large number of channels for data exchange, thereby increasing the efficiency of a manufacturing process.

As set forth above, according to exemplary embodiments of the present inventive concept, a first semiconductor chip and a second semiconductor chip, having the same structure, are mounted on a package substrate, and the second semiconductor chip may be mounted while being rotated 180 degrees with respect to the first semiconductor chip. Signal lines, connected to signal pads of a first semiconductor chip and a second semiconductor chip, are disposed in a single layer of a package substrate, so process efficiency may be increased, production costs may be reduced, and a degree of integration may be increased.

While exemplary embodiments of the present disclosure have been shown and described above, it will be apparent to those skilled in the art that modifications and variations could be made without departing from the scope of the present disclosure.

What is claimed is:

1. A semiconductor package, comprising:
a package substrate; and
a first semiconductor chip and a second semiconductor chip mounted on the package substrate and arranged in a first direction parallel to an upper surface of the package substrate,
wherein the second semiconductor chip is rotated by 180 degrees in a clockwise direction parallel to the upper surface of the package substrate with respect to the first semiconductor chip,
wherein each of the first semiconductor chip and the second semiconductor chip includes first signal pads, second signal pads disposed in a region different from that of the first signal pads, third signal pads arranged adjacent to a first boundary extending in the first direction and disposed between the first signal pads and the second signal pads, and fourth signal pads adjacent to a second boundary extending in the first direction and being parallel to the first boundary and disposed between the first signal pads and the second signal pads,
wherein each of the first, second, third, and fourth signal pads are equally distant from respective nearest edges of the respective semiconductor chip,
wherein the package substrate includes first signal lines connected to the first signal pads of the first semiconductor chip, second signal lines connected to the first signal pads of the second semiconductor chip, third signal lines connected to the second signal pads of the first semiconductor chip, and fourth signal lines connected to the second signal pads of the second semiconductor chip,
wherein the third signal pads of the first semiconductor chip and the fourth signal pads of the second semiconductor chip is separated from all signal lines and all circuits of the package substrate,
wherein the third signal pads and the fourth signal pads are configured of pads inputting and outputting the same signals, in each of the first semiconductor chip and the second semiconductor chip, and
wherein, in each of the first semiconductor chip and the second semiconductor chip, the number of the third signal pads is equal to the number of the fourth signal pads.

2. The semiconductor package of claim 1, wherein the package substrate includes a plurality of pads connected to the first to fourth signal lines,
wherein the third signal pads of the first semiconductor chip are disposed between the fourth signal pads of the first semiconductor chip and the plurality of pads, in a second direction perpendicular to the first direction and parallel to the upper surface of the package substrate, and
wherein the fourth signal pads of the second semiconductor chip are disposed between the third signal pads of the second semiconductor chip and the plurality of pads, in the second direction.

3. The semiconductor package of claim 2, wherein the plurality of pads are arranged adjacent to a first edge of the package substrate and connected at least one of a sensor array and a display panel, and
wherein the first edge extends in the first direction.

4. The semiconductor package of claim 3, wherein the package substrate includes a plurality of input/output pads disposed adjacent to a second edge of the package substrate and arranged in the first direction, and
wherein the second edge extends in the first direction and is parallel to the first edge.

5. The semiconductor package of claim 4, wherein a portion of the fourth signal pads of the first semiconductor chip are connected to first input/output pads among the plurality of input/output pads, and
wherein a portion of the third signal pads of the second semiconductor chip are connected to second input/output pads among the plurality of input/output pads.

6. The semiconductor package of claim 5, wherein the package substrate includes chip communication lines connecting a remainder of the fourth signal pads of the first semiconductor chip to a remainder of the third signal pads of the second semiconductor chip.

7. The semiconductor package of claim 1, wherein, in each of the first semiconductor chip and the second semiconductor chip, the first signal pads are disposed in a U-shape and the second signal pads are disposed in a U-shape.

8. The semiconductor package of claim 1, wherein, the third signal pads of the first semiconductor chip are disposed in the same position as the fourth signal pads of the second semiconductor chip, in a second direction perpendicular to the first direction and parallel to the upper surface of the package substrate.

9. The semiconductor package of claim 1, wherein, the fourth signal pads of the first semiconductor chip are disposed in the same position as the third signal pads of the second semiconductor chip, in a second direction perpendicular to the first direction and parallel to the upper surface of the package substrate.

10. The semiconductor package of claim 1, wherein the third signal pads of the first semiconductor chip and the fourth signal pads of the second semiconductor chip are not overlapped with any signal lines of the package substrate, in a direction perpendicular to the upper surface of the package substrate.

11. The semiconductor package of claim 1, wherein the first to fourth signal lines are disposed in an order of the first signal lines, the third signal lines, the fourth signal lines and the second signal lines, in the first direction.

12. A semiconductor package, comprising:
a package substrate; and
a first semiconductor chip and a second semiconductor chip mounted on the package substrate and arranged in a first direction parallel to an upper surface of the package substrate,
wherein the second semiconductor chip is rotated by 180 degrees in a clockwise direction parallel to the upper surface of the package substrate with respect to the first semiconductor chip,
wherein each of the first semiconductor chip and the second semiconductor chip includes first signal pads, second signal pads disposed in a region different from that of the first signal pads, third signal pads arranged adjacent to a first boundary extending in the first direction and disposed between the first signal pads and the second signal pads, and fourth signal pads adjacent to a second boundary extending in the first direction and being parallel to the first boundary and disposed between the first signal pads and the second signal pads,
wherein each of the first, second, third, and fourth signal pads are equally distant from respective nearest edges of the respective semiconductor chip,
wherein the package substrate includes first signal lines connected to the first signal pads of the first semiconductor chip, second signal lines connected to the first signal pads of the second semiconductor chip, third signal lines connected to the second signal pads of the first semiconductor chip, fourth signal lines connected to the second signal pads of the second semiconductor chip, and a plurality of pads arranged adjacent to a first edge of the package substrate extending in the first direction and connected to the first to fourth signal lines,
wherein the third signal pads of the first semiconductor chip and the fourth signal pads of the second semiconductor chip are physically separated from all signal lines of the package substrate, and
wherein the fourth signal pads of the first semiconductor chip and the third signal pads of the second semiconductor chip are connected to an external semiconductor package.

13. The semiconductor package of claim 12, wherein the third signal pads of the first semiconductor chip and the fourth signal pads of the second semiconductor chip are not overlapped with any signal lines of the package substrate, in a direction perpendicular to the upper surface of the package substrate.

14. The semiconductor package of claim 12, wherein, in each of the first semiconductor chip and the second semiconductor chip, the number of the third signal pads is equal to the number of the fourth signal pads.

15. The semiconductor package of claim 14, wherein, in each of the first semiconductor chip and the second semiconductor chip, signals input and output by the third signal pads are the same as signals input and output by the fourth signal pads.

16. The semiconductor package of claim 12, wherein the package substrate includes first input/output lines connected to a portion of the fourth signal pads of the first semiconductor chip, second input/output lines connected to a portion of the third signal pads of the second semiconductor chip, and chip communication lines connected to a remainder of the fourth signal pads of the first semiconductor chip and a remainder of the third signal pads of the second semiconductor chip.

17. The semiconductor package of claim 16, wherein, in the package substrate, the first to fourth signal lines, the first and second input/output lines and the chip communication lines are disposed in a single layer.

* * * * *